United States Patent [19]

Verkuil

[11] Patent Number: 5,767,691
[45] Date of Patent: Jun. 16, 1998

[54] PROBE-OXIDE-SEMICONDUCTOR METHOD AND APPARATUS FOR MEASURING OXIDE CHARGE ON A SEMICONDUCTOR WAFER

[75] Inventor: Roger Leonard Verkuil, Wappingers Falls, N.Y.

[73] Assignee: International Business Machines Corporation, Armonk, N.Y.

[21] Appl. No.: 572,600

[22] Filed: Dec. 14, 1995

Related U.S. Application Data

[63] Continuation of Ser. No. 173,320, Dec. 22, 1993, Pat. No. 5,500,607.
[51] Int. Cl.⁶ .................................................. G01R 31/02
[52] U.S. Cl. .................................................. 324/761
[58] Field of Search ............................... 324/72.5, 761, 324/754; 439/86, 219, 482

[56] References Cited

U.S. PATENT DOCUMENTS

| | | | |
|---|---|---|---|
| 3,995,216 | 11/1976 | Yun | 324/158 |
| 4,988,212 | 1/1991 | Sun et al. | 374/161 |
| 5,023,561 | 6/1991 | Hillard | 324/719 |
| 5,036,271 | 7/1991 | Mazur et al. | 324/158 |
| 5,132,934 | 7/1992 | Quate et al. | 365/151 |
| 5,134,364 | 7/1992 | Karpman et al. | 324/761 |
| 5,140,272 | 8/1992 | Nishimatsu et al. | 324/662 |
| 5,357,109 | 10/1994 | Kusumoto | 250/306 |
| 5,393,647 | 2/1995 | Neukermans et al. | 430/320 |

FOREIGN PATENT DOCUMENTS

| | | | |
|---|---|---|---|
| 1-82541 | 3/1989 | Japan | H01L 21/66 |
| 2-205046 | 8/1990 | Japan | H01L 21/66 |

OTHER PUBLICATIONS

IBM Technical Disclosure Bulletin, vol. 25, No. 11A, pp. 5736–5737, Apr. 1983, Hutchings, et al., "Multi–Chip Probe Card for Capacitance–Voltage Measurements".

Primary Examiner—Ernest F. Karlsen
Assistant Examiner—Russell M. Kobert
Attorney, Agent, or Firm—Susan M. Murray; Steven Capella

[57] ABSTRACT

A probe, a method of making the same, and a manner of using the same, suitable for "Metal-Oxide-Semiconductor (MOS) like" electrical characterization measurements on semiconductor substrates having overlying dielectric layers is disclosed. The probe comprises an electrically conductive probe needle, the needle having a rounded tip end of a first radius, the rounded tip end further being suitable for undergoing a plastic deformation. The needle is positioned above the dielectric layer on the semiconductor substrate and the needle tip forced down onto the smooth surface of the dielectric layer in a controlled manner for causing the needle tip to undergo a plastic deformation in which an outer portion of the rounded tip end is maintained at the first radius and an inner portion of the rounded tip end is increased to a second radius, the second radius being larger than the first. During use, the plastically deformed, conditioned probe optimally achieves a highly conformal, intimate, and well-defined contact area needed for accurate electrical characterization measurements, wherein the silicon elastically conforms to the conditioned probe in contrast to similar electrical characterization measurement techniques involving the elastic conformation of a probe tip to the silicon.

3 Claims, 3 Drawing Sheets

PROBE-OXIDE-SEMICONDUCTOR METHOD AND APPARATUS FOR MEASURING OXIDE CHARGE ON A SEMICONDUCTOR WAFER

CROSS REFERENCE TO RELATED APPLICATION

This application is a continuation of U.S. Ser. No. 08/173,320, filed Dec. 22, 1993, and entitled "Probe Oxide Semiconductor Method and Apparatus for Measuring Oxide Charge on a Semiconductor Wafer", now U.S. Pat. No. 5,500,607.

BACKGROUND OF THE INVENTION

1. Field of the Invention

The present invention generally relates to a method and apparatus for measurement of electrical properties in a semiconductor wafer, and more particularly, to the measurement of the electrical properties of a dielectric layer on a semiconductor wafer.

2. Discussion of the Related Art

The determination of electrical properties of a dielectric layer on a semiconductor wafer body is a critical factor in the production of such wafers as is well known in the art. Measurements such as dielectric rupture voltage, dielectric field strength, time dependent dielectric breakdown and oxide charge measurements, for example, are typically accomplished by first fabricating metal or doped polysilicon mesas over the dielectric layer that serve as electrical contacts to which measurement probes may be applied. The metal mesas or dots, together with the dielectric layer and substrate, form a metal-oxide-semiconductor (MOS) structure. Fabrication of the metal mesas is a time-consuming and costly operation. It typically involves the selective evaporation of aluminum metal dots onto the dielectric or oxide layer, as well as the evaporation of a blanket aluminum layer on the back of the wafer. With respect to the latter, any oxide on the back side of the wafer must first be stripped from the back side of the wafer before the back side aluminum evaporation. Generally, a metal mask with an array of various size apertures is positioned immediately in front of the wafer to determine where dots will be formed during aluminum evaporation. A sintering and alloying process is then completed to reduce interface states charge at the oxide/silicon interface and to reduce contact resistance between the back side aluminum and silicon. Another disadvantage of this technique is its invasiveness within the wafer structure, resulting in inaccuracies being introduced in electrical measurements.

In addition to the above, MOS Capacitance-Voltage (C-V) measurements are very useful for fixed, mobile, and surface states charge characterization; however, for a variety of charge measurement requirements, the conventional MOS method can be prohibitively expensive and inconvenient. For MOS charge measurements on monitor wafers, sample preparation typically includes frontside aluminum dots and backside blanket aluminum. Such sample preparation is costly, time consuming and destructive. In addition, for MOS charge monitoring on product wafers, a highly desirable feature, such as being able to test arbitrary locations at almost any stage of processing, is not a practical possibility.

In U.S. Pat. No. 5,023,561, entitled "Apparatus and Method For Non-invasive Measurement of Electrical Properties of a Dielectric Layer in a Semiconductor Wafer", assigned to Solid State Measurements, Inc., and issued on Jun. 11, 1991, an apparatus is disclosed which includes a probe tip having a uniformly flat contact portion. The metal probe of the '561 patent is used for contacting a dielectric layer on a wafer in order to obtain C-V measurements for dielectric charge determinations. To liken, but still distinguish, the use of a probe electrode for "MOS like" measurements from MOS, the term Probe-Oxide-Semiconductor (hereinafter "POS") will be used throughout the text of this specification. The geometry and operating conditions of the '561 metal POS probe includes an extremely flat geometry and a relatively low, non-deforming pressure on the order of 10 psi., the low pressure being a proper pressure for avoiding damage of the test sample surface. The flat geometry of the '561 metal POS probe presents a sharp edge, which if excessive force were applied to the probe in contacting the dielectric, would increase the probability for damage and cracking to occur in the dielectric layer. For an increasingly thin dielectric layer range, on the order of 10–50 nm (100–500 Å), presently being used in CMOS technologies, the '561 metal POS probe is not well suited. For example, in the instance of a 10 nm thick dielectric, the effective air gap between the '561 probe tip and the dielectric surface would need to be less than 0.3 nm for a C-V characteristic to have less than a 10% error. This would be difficult to achieve, even with a perfectly flat probe, since 0.3 nm could be on the order of the surface roughness of the oxide or dielectric layer under test. To compensate for any surface roughness using the '561 probe, a higher pressure may be applied to close up any small air gaps; however, the resultant stress near the sharp edge of the flat probe greatly increases the likelihood of surface damage to the test sample. Additionally, the '561 POS test probe involves a polishing process, not subject to high repeatability, for use in making the same, and thus results in increased variations between probes.

There is thus needed an improved method and apparatus well suited for obtaining MOS C-V measurements, absent the problems, difficulties, and limitations, as discussed above.

SUMMARY OF THE INVENTION

An object of the present invention is to provide an improved POS probe, and a method of making the same, for overcoming the above-mentioned disadvantages in the art.

Another object of the present invention is to provide a POS probe, and method of making the same, for improved POS measurements through improved coupling to a dielectric being measured.

According to the invention, a probe, and method of making the same, suitable for Probe-Oxide-Semiconductor (POS) electrical characterization measurements of a dielectric layer on a semiconductor substrate comprises an electrically conductive probe needle, the needle having a rounded tip end of a first radius, the rounded tip end further being suitable for undergoing a plastic deformation. The needle is positioned above the dielectric layer on the semiconductor substrate and the needle tip forced down onto the smooth surface of the dielectric layer in a controlled manner for causing the needle tip to undergo a plastic deformation in which an outer portion of the rounded tip end is maintained at the first radius and an inner portion of the rounded tip end is increased to a second radius, the second radius being larger than the first.

BRIEF DESCRIPTION OF THE DRAWINGS

The foregoing and other teachings of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

Figure 1:
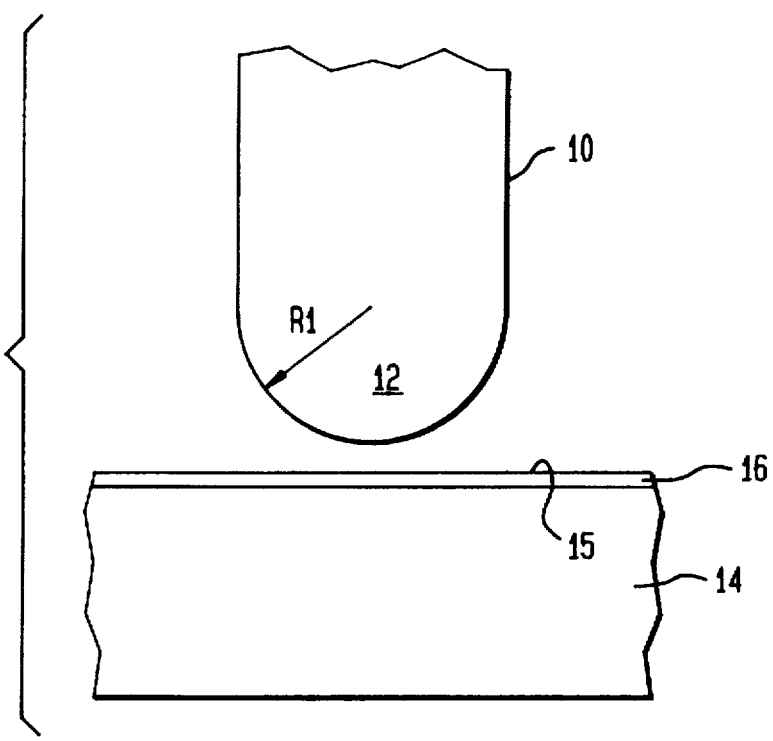
FIG. 1 shows a first step in the making of a probe according to the present invention.
Figure 2:
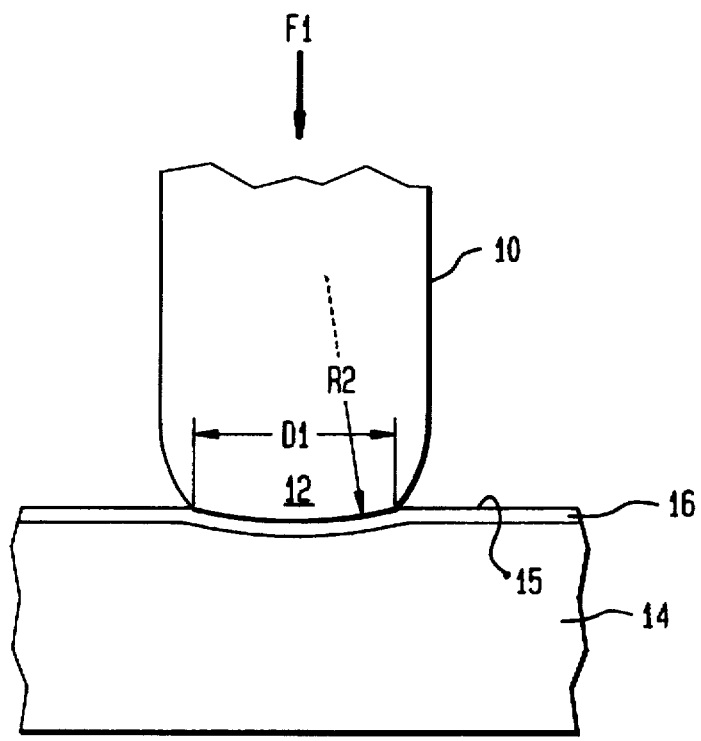
FIG. 2 shows a second step in the formation of a probe according to the present invention.
Figure 3:
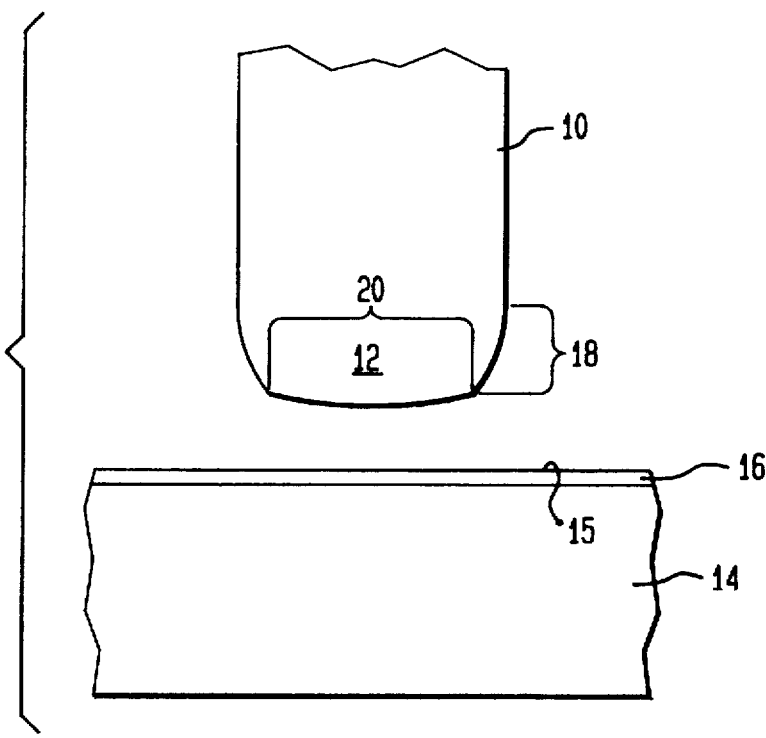
FIG. 3 shows a probe according to the present invention in preparation for a C-V measurement.

Referring now to FIGS. 1 and 2, the method according to the present invention for forming a probe suitable for POS electrical characterization measurements begins with providing an electrically conductive probe needle 10. The needle 10 is characterized by a rounded tip end 12 of a first radius of curvature $R_1$, the rounded tip end 12 being suitable for undergoing a desired plastic deformation, i.e., a permanent deformation, as will be explained in further detail hereinbelow. The needle 10 preferably comprises a stable, corrosion resistant, metal and further having mechanical properties that provide for plastic deformation. Such a needle can comprise a tungsten probe needle, such as are commercially available from Moser Jewel Company of Perth Amboy, N.J. Typical dimensions for needle 10 may comprise, for instance, a length dimension on the order of one (1) inch, a cross-sectional dimension on the order of a twenty-eight (28) mil diameter along a major portion thereof, a tapered section having a taper on the order of ten (10) degrees, and a round tip with a radius of curvature on the order of one-half (0.5) mils (or as expressed in microns, 12.5 μm). Other dimensions, suitable to the requirements of a particular POS measurement application, may be used as necessary. It should be noted that present commercially available tungsten probe needles are inadequate for the purposes of performing POS electrical characterization measurements, that is, they perform poorly due to their non-optimal shape, as will be subsequently discussed. According to the present invention, an optimal shape comprises a needle tip having a radius of curvature that is first large, over a short arc, and then rapidly changes to a small radius of curvature with increasing arc. The end portion of the needle tip, having a large radius of curvature, is used for making intimate, highly conformal contact with the dielectric layer of interest. Beyond the arc of the needle tip corresponding to the large radius of curvature, the much smaller radius of curvature of the needle tip rapidly curves away from the dielectric layer of interest (i.e., the semiconductor surface) in order to create a well defined intimate contact area and further provide for accurate POS measurements, discussed supra.

According to the present invention, needle 10 is advantageously conditioned according to the following. Needle 10 is positioned above a semiconductor substrate 14. Substrate 14 may comprise any suitable substrate, capable of elastic deformation (i.e., non-permanent deformation), such as a silicon substrate. On a top surface of substrate 14 is a dielectric layer 16, dielectric layer 16 comprising a thermal oxide layer, for example. Dielectric layer 16 is further characterized by a relatively smooth top surface 15. Semiconductor substrates and dielectric layers are well known in the art and thus not discussed in great detail herein.

As indicated above, needle 10 is positioned above substrate 14, such that the rounded tip 12 is proximate to surface 15 of dielectric layer 16. Thereafter, needle 10 is forced down onto the smooth surface 15 of the dielectric layer 16 in a controlled manner for causing the needle tip 12 to undergo a desired plastic deformation (or permanent deformation) in which an outer portion 18 of the rounded tip end 12 is maintained at the first radius $R_1$ and an inner portion 20 of the rounded tip end 12 is increased to a second radius $R_2$, the second radius $R_2$ being larger than the first radius $R_1$.

More particularly, needle 10 is positioned substantially perpendicular to the top surface 15 and the semiconductor substrate 14. Needle tip end 12 is slowly and gently lowered down and brought into contact with the dielectric layer 16, and thereafter forced down onto dielectric layer 16 with a force sufficient for developing a conditioning pressure (i.e., plastic deformation pressure) to provide the desired conditioning of the probe needle 10 (i.e., plastic deformation). The conditioning pressure developed between probe needle 10 and the dielectric layer 16/substrate 14 structure combination, must be sufficient for causing needle tip 12 to undergo the desired plastic deformation, that is, corresponding to a pressure for forming the inner portion 20 of probe tip 12 to have a desired radius, while maintaining the outer portion 18 at the first radius. The force sufficient for developing the conditioning pressure is applied in such a manner as to avoid fracturing of the probe tip 12 while enabling the desired plastic deformation thereof to occur.

In a first instance, a force $F_1$ is applied to probe 10, the force $F_1$ being sufficient so as to develop the conditioning pressure comprising a pressure in a range from a first pressure to a second pressure. For example, force $F_1$ comprises an increasing force, from a first force to a second force, corresponding to a range on the order of 0.001–0.016 pounds (i.e., 0.01–7.3 grams). Force $F_1$ is sufficient to provide a conditioning pressure in the range from a first pressure on the order of 0–100 psi to a second pressure on the order of 100,000–150,000 psi. The second pressure is, more preferably, on the order of 130,000 psi.

Preferably, the force $F_1$ is applied in a gradual manner, that is, gradually from the first force to the second force, whereby pressure is gradually developed, beginning from the first pressure and increasing to the second pressure, at a controlled rate to avoid fracturing of the probe tip 12. Force $F_1$ may be gradually increased in either a continuous manner or an incremental manner. In the continuous manner, the force is continuously increased at a slow rate. In the incremental manner, the force is incrementally increased, for example, in increments of approximately 0.0008 pounds, at a slow rate.

A gradual increase in the applied force $F_1$ is highly desirable since material comprising the probe tip 12 must absorb and/or relieve the pressure applied as a result of the force $F_1$, and additionally, at the rate at which force $F_1$ is applied. That is, the material comprising probe tip 12 undergoes a material or molten flow to relieve the pressure applied as a result of force $F_1$. If the material comprising probe tip 12 is stressed beyond it's ability to flow, a rupture or fracture in the probe tip 12 can occur. Thus, the force $F_1$ is selected so as to substantially reduce any excessive shock to the probe tip 12 material, thereby avoiding probe tip 12 material fracture.

The dielectric layer 16 and the substrate 14 undergo a limited amount of elastic or temporary deformation during the conditioning of probe 10, and more particularly, conditioning of probe tip 12, as shown in FIG. 2. This is due in part because of the somewhat elastic nature of the dielectric layer 16 and substrate 14. The limited temporary deformation is primarily due to the high pressure contact (i.e., over a small contact area) with the relatively stiffer needle tip 12. When elastic bodies are brought into contact, under high pressure, temporary elastic deformation occurs near the points of contact. Solid materials are composed of atoms that are held together by bonds that behave as microscopic springs. Elastic behavior of various materials can be described by materials constants that relate stress (applied pressure) to strain (change in physical dimensions due to stress). Young's Modulus, Y, is one such constant. The probe tip comprising tungsten is relatively much stiffer than the silicon substrate (i.e., the tungsten probe tip having about a three times higher Young's Modulus than silicon).

As a result of the controlled plastic deformation of the probe tip 12 according to the invention, the probe tip 12 comprises an optimal shape for POS electrical characteristic measurements. That is, the tip 12 has a much larger radius of curvature, on the order of 135 mils (or as expressed in microns, 3,500 μm), for example, and is partially work hardened for increased mechanical stability. Thus, the conditioned probe 10 provides a good compromise between 1) the small area needed for a high pressure, intimate contact and 2) a large enough area necessary for minimizing electrical noise in POS measurements.

Figure 5:
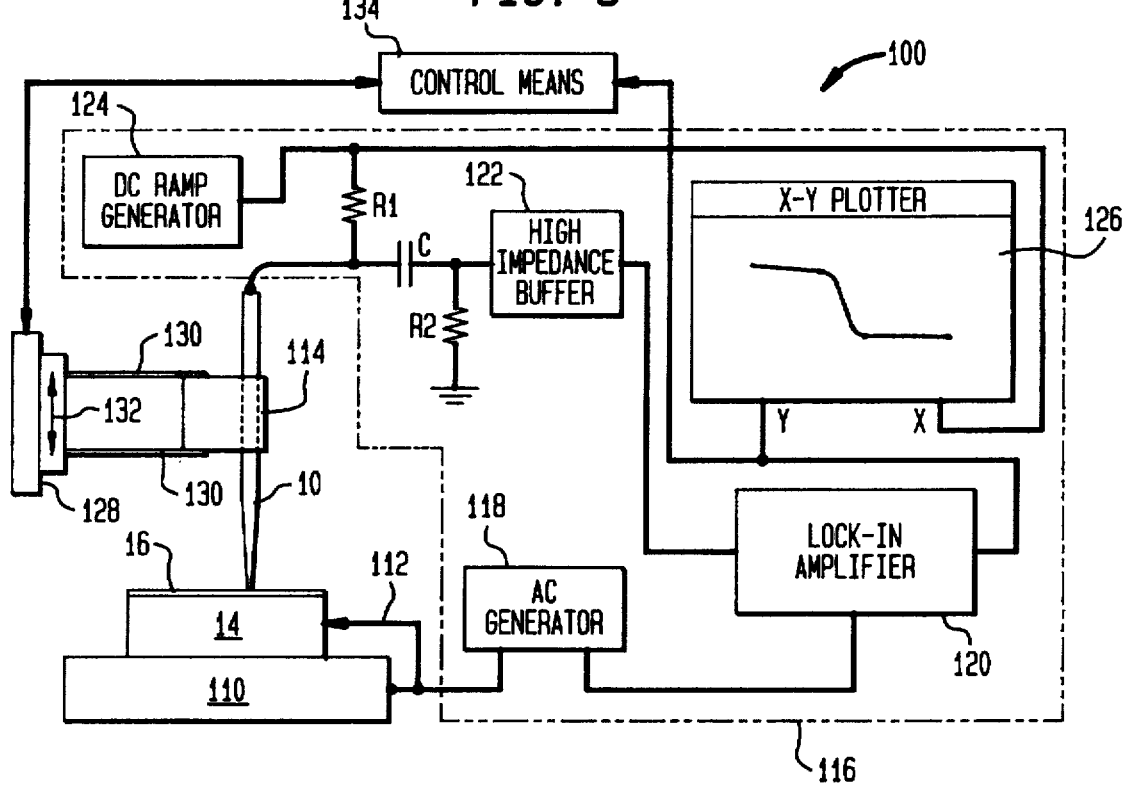
FIG. 5 shows a C-V measurement incorporating a probe according to the present invention.

In an alternate embodiment, a POS apparatus 100 for producing a POS probe according to the method described above, will now be described with reference to FIG. 5 and further in accordance with the present invention. POS apparatus 100 further provides for electrical characterization measurements of a dielectric layer 16 on a semiconductor substrate 14 utilizing the POS probe of the present invention. POS apparatus 100 comprises a means 110 for supporting the semiconductor substrate in a prescribed position, such as any well known suitable conductive semiconductor wafer chuck. A first suitable contact means 112 electrically contacts the substrate 14 and substrate support means 110. A suitable means 114, such as a non-conductive clamp, is provided for receiving electrically conductive probe needle 10, and preferably to position probe needle 10 substantially perpendicular to the semiconductor substrate 14. Probe needle 10, when unconditioned, comprises a needle having a rounded tip end of a first radius, the rounded tip end further being suitable for undergoing a plastic deformation as discussed hereinabove.

A means 116 is electrically connected between said first contacting means 112 and the probe needle 10. Means 118 provides an electrical characterization measurement, representative of an electrical characteristic of the dielectric layer 16, such as a capacitance-voltage measurement, when the probe needle 10 is in electrical contact with the dielectric layer as will be further discussed hereinbelow. Electrical characterization measurement means 116 comprises an AC generator 118 for providing an AC output signal to wafer chuck 110 and substrate 14 via electrical contact means 112. AC generator may comprise any suitably known generator. AC generator 118 is further connected to lock-in amplifier 120 for providing a synchronous AC output signal from AC generator 118 to a synchronous input of lock-in amplifier 120. Lock-in amplifier 120 may comprise any suitably known lock-in amplifier. Electrical characterization means 116 further comprises a circuit network of resistor R1, capacitor C, and resistor R2, electrically connected to probe 10 at an opposite end from probe tip 12. A high impedance buffer 122 is further connected at one end thereof at a node between capacitor C and resistor R2 and is further connected at a second end thereof to lock-in amplifier 120. High impedance buffer 122 is placed close to the probe needle 10 to provide good signal-to-noise traces with respect to the relatively small POS capacitance values to be measured. Buffer 122 is electrically connected to a signal input of lock-in amplifier 120 to further enhance signal-to-noise. A DC ramp generator 124 is electrically connected to an opposite end of resistor R1 and further connected to an X-input of X-Y plotter 126. DC ramp generator 124 and X-Y plotter 126 may comprise any suitable DC ramp generator or X-Y plotter, respectively, known in the art. The signal output of lock-in amplifier 120 is connected to the Y-input of X-Y plotter 126.

A positioning means 128 is mechanically connected to receiving means 114 for positioning receiving means 114 such that a probe needle 10 received therein is positioned above the dielectric layer 16 on the semiconductor substrate 14. Positioning means 128 can comprise, for example, any suitable mechanical means, such as a linear translation device having flexure arms 130 or flat springs attached thereto. Preferably, positioning means 128 is electrically controllable. Translation of flexure arms 130 in an upward/downward movement, as indicated by arrow 132 in FIG. 5, effectively raises/lowers needle 10. Continued translation of flexure arms 130 downward, subsequent to needle 10 contacting dielectric layer 16, results in a force being applied to needle 10. The amount of deflection of flexure arms 130 is proportional to an amount of force applied to needle 10 upon dielectric layer 16, thus providing an indication of the amount of force being applied to needle 10. Any suitable means, such as a displacement transducer and appropriate electronic circuitry, may be used for measuring the amount of deflection of flexure arms 130.

A control means 134 is electrically connected to positioning means 128 to control positioning means 128 to operate i) in a first mode of operation to condition the probe needle 10 and ii) in a second mode of operation for obtaining an electrical characterization measurement from the electrical characterization measurement means 116. Control means 134 is further electrically connected to lock-in amplifier 120 for receiving the output signal therefrom. Control means 134 can comprise any suitable controller, such as a computer or the like, the controller being programmed by known techniques for performing the desired functions as described herein.

In further discussion thereof, control means 134 controls positioning means 128 for providing a desired downward force. In particular, positioning means 128 is controlled by control means 134 to be operable in the first and second modes as follows. In the first mode, positioning means 128 forces the needle tip 12 down onto the smooth surface of the dielectric layer 16 in a first controlled manner for causing the needle tip 12 to undergo a plastic deformation in which an outer portion 18 of the rounded tip end 12 is maintained at the first radius $R_1$ and an inner portion 20 of the rounded tip end 12 is increased to a second radius $R_2$, the second radius being larger than the first. In the second mode, positioning means 128 forces the needle tip 12 down onto the smooth surface of the dielectric layer 16 in a second controlled manner for intimately and electrically contacting with the dielectric layer 16 within a contacting diameter $D_2$, the contacting diameter $D_2$ substantially on the order of the inner portion 20 (i.e., diameter $D_1$) of the rounded tip end 12.

In operation, the POS apparatus 100 operates in accordance with the present invention for conditioning a POS probe 10 and for effecting POS electrical characterization measurements as follows. For the conditioning of a POS probe 10, an unconditioned probe needle in inserted into receiving means 114. Control means 134 controls positioning means 128 to bring the needle tip 12 gently into contact with the dielectric layer 16, and thereafter forces the needle tip 12 down onto the dielectric layer 16 with a force sufficient to develop a pressure over a range from a first pressure to a second pressure, whereby the needle tip undergoes a desired plastic deformation and is further work hardened thereby. Preferably, the pressure is over a range from a first pressure on the order of 0–100 psi to a second pressure on the order of between 100,000–150,000 psi. More particularly, the second pressure is on the order of 130,000 psi.

The force $F_1$ applied is sufficient to gradually develop the pressure from the first pressure to the second pressure, wherein the second pressure is greater than the first. The applied force $F_1$ may either be i) a continuously increasing force, i.e., continuously increasing from a first force to a second force, sufficient to gradually develop the pressure continuously from the first pressure to the second pressure, or ii) an incrementally increasing force, i.e., incrementally increasing from a first force to a second force, sufficient to gradually develop the pressure incrementally (in increments on the order of 5,000 to 10,000 psi for example) from the first pressure to the second pressure.

Monitoring of an amount of the applied force to the probe needle 10 can be accomplished by monitoring an amount of deflection of flexure arms 130, as discussed above, the amount of deflection being proportional to the amount of force being applied. The monitored applied force provides feedback for use by control means 134 for controlling the positioning of positioning means 128.

Figure 4:
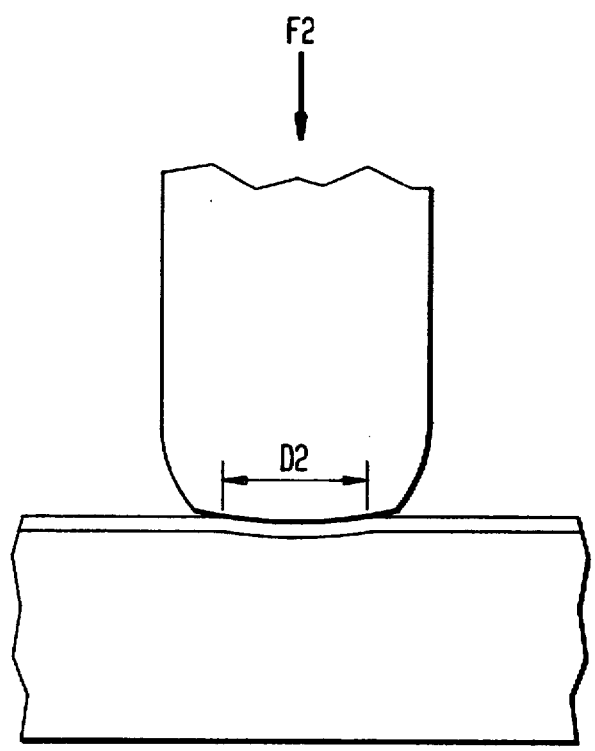
FIG. 4 shows a probe according to the present invention during a C-V measurement.

For effecting POS electrical characterization measurements, apparatus 100 operates as follows. A conditioned POS probe 10, conditioned according to the above, is inserted into receiving means 114. Control means 134 controls positioning means 128 to be operable in a measurement mode for forcing the needle tip 12 down onto the smooth surface of the dielectric layer 16 in a controlled manner. Needle tip 12 is forced down onto the smooth surface of dielectric layer for intimately and electrically contacting with the dielectric layer within a contacting diameter $D_2$ as shown in FIG. 4. The contacting diameter $D_2$ is on the order of the inner portion 20 of the rounded tip end 12.

In further detail, positioning means 128 is controlled by control means 134 for bringing the needle tip 12 gently into contact with the dielectric layer 16, and thereafter forcing the needle tip 12 down onto the dielectric layer 16 with a force $F_2$ sufficient to develop a pressure on the order of 20,000 psi. In this manner, the needle tip 12 is buried into the dielectric layer 16 and the surface of semiconductor substrate 14 within the contacting diameter $D_2$. Because of the elastic nature of dielectric layer 16 and the underlying substrate 14, the dielectric layer and substrate return to their corresponding normal shapes upon retraction of the probe tip 12 from the surface of dielectric layer 16. That is, the elastic deformation limit of the dielectric layer and semiconductor wafer are not exceeded during the measurement mode. An optimal contact for capacitance measurements is thus achieved using the conditioned probe needle 10 according to the present invention. Furthermore, the conditioned probe needle 10 is work hardened and thus does not undergo appreciable deformation during capacitance measurements, rather, the dielectric layer and underlying substrate undergo the deformation. Measurements taken using the present invention are thus very repeatable. In addition, a conditioned probe needle according to the present invention provides a lengthened useful lifetime.

Figure 6:
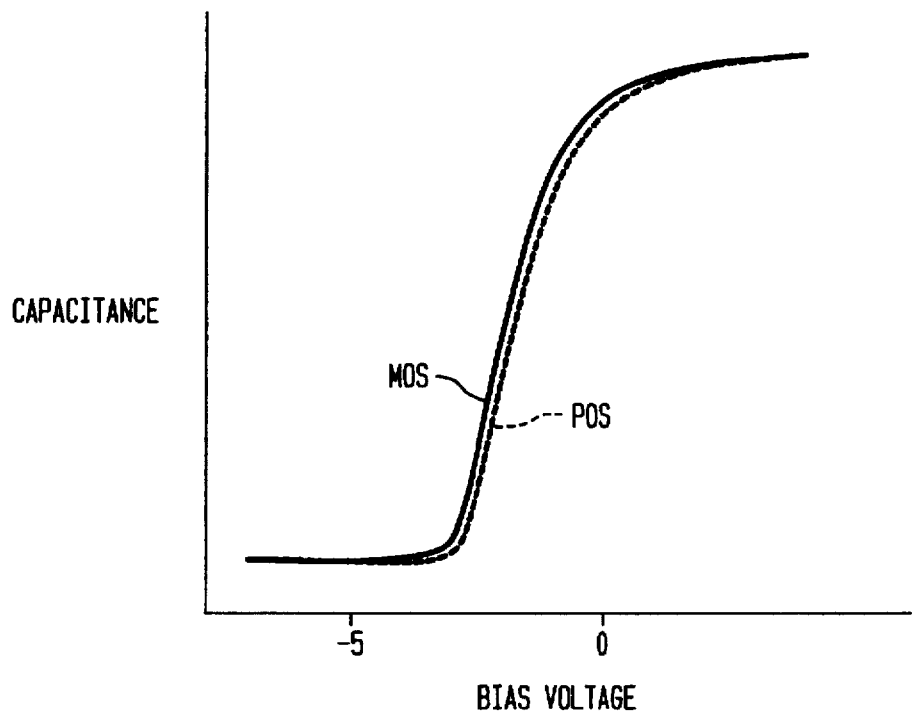
FIG. 6 is illustrative of measurement results obtained using a probe according to the present invention, in comparison with results obtained using a conventional MOS C-V method.

Upon the achieving of the positioning of needle tip 12 onto dielectric layer 16, as discussed above for the measurement mode, an electrical characterization measurement may be made, the measurement being similar to that using the conventional MOS measurement method. A plot of POS measurements in comparison to MOS measurements taken using the same substrate, the POS measurement being performed at approximately 0.5 mm from a MOS dot, is shown in FIG. 6.

In another embodiment, apparatus 100 may operate to condition a probe needle 10 in response to an electrical characterization measurement or measurements. That is, control means 134 may monitor a measured capacitance, between the probe tip 12 and the substrate 14, during the conditioning of the probe tip. In this instance, the measured capacitance would be compared with a desired capacitance, the desired capacitance corresponding to a known capacitance for a particular dielectric layer being used. In response to the measured capacitance, control means 134 can thus advantageously control positioning means 128 for providing force $F_1$ for conditioning the probe needle 10, as discussed above.

There has thus been shown a method of forming a POS probe needle. The method and apparatus of the present invention are well suited for providing a desired electrical characterization measurement of a dielectric layer upon a semiconductor substrate. The present invention further provides a method and apparatus for advantageously providing a highly conformal, well-defined, intimate contact for electrical characterization measurements.

While the invention has been particularly shown and described with reference to the preferred embodiment thereof, it will be understood by those skilled in the art that various changes in form and detail may be made therein without departing from the spirit and scope of the invention.

What is claimed is:

1. A Probe-Oxide-Semiconductor (POS) apparatus for electrical characterization measurements of a dielectric layer on a semiconductor substrate, the dielectric layer having a smooth surface, said apparatus comprising:

means for supporting the semiconductor substrate in a prescribed position;

first contact means for electrically contacting the substrate;

means for receiving an electrically conductive probe needle, the needle having a rounded tip end characterized by an outer portion having a first radius, and an inner portion having a second radius, the second radius being larger than the first radius, the rounded tip end further being work hardened;

means electrically connected between said first contacting means and the probe needle for providing an electrical characterization measurement, the electrical characterization measurement representative of an electrical characteristic of the dielectric layer when the probe needle is in electrical contact therewith;

means for positioning said receiving means such that the probe needle received therein is positioned above the dielectric layer on the semiconductor substrate, said positioning means operable in a measurement mode for forcing the needle tip down onto the smooth surface of the dielectric layer within a contacting diameter, the contacting diameter substantially on the order of the inner portion of the rounded tip end, and for elastically conforming the dielectric layer and the semiconductor substrate to the inner portion of the probe tip within the contacting diameter; and, means for controlling said positioning means to operate in the measurement mode for obtaining an electrical characterization measurement from said electrical characterization measurement means.

2. A probe suitable for Probe-Oxide-Semiconductor (POS) electrical characterization measurements of a dielectric layer on a semiconductor substrate, the dielectric layer having a smooth surface, the probe comprising:

an electrically conductive probe needle having a rounded tip end permanently defined by a first radius at an outer portion of the rounded tip end and by a second radius at an inner portion of the rounded tip end, the second radius being larger than the first radius, the first radius defining said outer portion and the second radius defining said inner portion both being centered with respect to said tip's center axis, the radius of said outer portion being centered closer to said rounded tip end than the radius of said inner portion, where the inner portion of the rounded tip end is working hardened.

3. The probe of claim 2, wherein the probe material comprises tungsten, the first radius is on the order of 0.5 mils and the second radius is on the order of 135 mils.

* * * * *